United States Patent
Tao et al.

(10) Patent No.: US 12,163,831 B2
(45) Date of Patent: Dec. 10, 2024

(54) APD BIAS CIRCUIT WITH DUAL ANALOG FEEDBACK LOOP CONTROL

(71) Applicant: SIGNIFY HOLDING B.V., Eindhoven (NL)

(72) Inventors: Haimin Tao, Eindhoven (NL); Christian Jordan, Venlo (NL); Aleksandar Sevo, Eindhoven (NL); Karnekumar Arulandu, Breda (NL)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 18/568,420

(22) PCT Filed: Jun. 3, 2022

(86) PCT No.: PCT/EP2022/065253
§ 371 (c)(1),
(2) Date: Dec. 8, 2023

(87) PCT Pub. No.: WO2022/258536
PCT Pub. Date: Dec. 15, 2022

(65) Prior Publication Data
US 2024/0271998 A1 Aug. 15, 2024

(30) Foreign Application Priority Data

Jun. 11, 2021 (EP) .................................... 21178940
Jul. 13, 2021 (EP) .................................... 21185190

(51) Int. Cl.
*G01J 1/44* (2006.01)
*G01K 7/22* (2006.01)

(52) U.S. Cl.
CPC ................. *G01J 1/44* (2013.01); *G01K 7/22* (2013.01); *G01J 2001/444* (2013.01); *G01J 2001/4466* (2013.01)

(58) Field of Classification Search
CPC ................. G01J 1/44; G01J 2001/444; G01J 2001/4466; G01K 7/22
See application file for complete search history.

(56) References Cited

U.S. PATENT DOCUMENTS

| | | | | |
|---|---|---|---|---|
| 6,894,266 B2 * | 5/2005 | Richard | ................. | H03K 19/14 |
| | | | | 250/214 R |
| 7,433,606 B2 * | 10/2008 | Wernlund | .......... | H04B 10/6911 |
| | | | | 250/214 R |
| 2016/0163886 A1 | 6/2016 | Wang | | |

FOREIGN PATENT DOCUMENTS

| | | | |
|---|---|---|---|
| CN | 103135651 A | 6/2013 | |
| CN | 103457673 A | 12/2013 | |

(Continued)

*Primary Examiner* — Seung C Sohn

(57) ABSTRACT

A bias circuit (100) of an avalanche photodiode, APD, comprising: a voltage conversion module (110) connected to the APD, wherein the voltage conversion module (110) is configured to convert an input supply voltage (Vin) to a bias voltage for the APD; an error amplifier (120) connected to the voltage conversion module (110) for implementing a feedback control; a voltage feedback loop (130) configured to provide the error amplifier (120) a first analog signal related to the bias voltage; and a current feedback loop (140) configured to provide the error amplifier (120) a second analog signal related to the APD current; wherein the error amplifier (120) is configured to control the voltage conversion module (110) based on the first and the second analog signals.

13 Claims, 4 Drawing Sheets

(56) References Cited

FOREIGN PATENT DOCUMENTS

CN         210669893 U     6/2020
FR           2490404 A1     3/1982

\* cited by examiner

APD BIAS CIRCUIT WITH DUAL ANALOG FEEDBACK LOOP CONTROL

CROSS-REFERENCE TO PRIOR APPLICATIONS

This application is the U.S. National Phase application under 35 U.S.C. § 371 of International Application No. PCT/EP2022/065253, filed on Jun. 3, 2022, which claims the benefit of European Patent application Ser. No. 21/178, 940.9, filed on Jun. 11, 2021 and European Patent Application No. 21185190.2, filed on Jul. 13, 2021. These applications are hereby incorporated by reference herein.

FIELD OF THE INVENTION

The invention relates to the field of an APD bias circuit. More particularly, various methods and apparatus are disclosed herein related to the feedback loop control in an APD bias circuit.

BACKGROUND OF THE INVENTION

In optical communication, a light sensor is used to convert a received optical signal to an output electrical signal, which can be a photodiode (PD), an Avalanche photodiode (APD), Silicon photomultiplier (SiPM), or another type of light sensor.

In addition to implementing an optical to electrical conversion, APDs have another nice property. During operation, APDs are reverse biased and have an internal multiplication gain. The internal gain is typically tens to hundreds for Si APDs depending on the reverse bias voltage. Thus, an APD allows detection of very weak optical signals. This is advantageous as compared to a photodiode, which cannot amplify a signal.

Therefore, an APD is a very promising candidate to be used as a detector for optical wireless applications, such as Li-Fi communication. With an internal gain provided by an APD, the required detector size may be greatly reduced while providing a same signal strength sufficient for further signal processing. Alternatively, the transmission power may be reduced to carry out optical wireless communication between two remote devices.

One problem associated with APD is the gain temperature dependency and large tolerances between parts. If a fixed reverse bias voltage is applied, the gain reduces significantly at high temperatures and results in much reduced signal and signal to noise ratio (SNR). For these reasons, compensations are usually applied to APD reverse bias circuits. For example, the temperature of the APD is monitored and then an adjusted bias voltage is applied for that temperature. Such adjustment means are often implemented with the aid of a microcontroller (MCU). A lookup table may be stored in the MCU, and a dedicated algorithm is implemented digitally.

CN103457673A relates to a method and device for improving saturated light power of an APD optical receiver with a bias circuit and a monitoring circuit.

US2016163886A1 relates to a biasing voltage generating circuit for generating a required reverse biasing voltage of an avalanche photodiode (APD), which includes a boost power converter configured to operably convert an input voltage into a higher output voltage according to a feedback signal and a reference signal, and to apply the output voltage to be a reverse biasing voltage of the APD; a reference signal generating circuit configured to operably generate the reference signal; and a control circuit.

SUMMARY OF THE INVENTION

As disclosed above, an APD reverse bias voltage compensation loop is typically implemented in MCU with digital circuits, resulting in a relatively large circuit size, higher power consumption, and a prolonged product development cycle. On the other hand, one promising application area of APDs is to be assembled in a compact optical front end (OFE) module for integration in consumer electronics, such as a smartphone, a tablet, a remote controller, or another electronic device. For such applications, size, cost, and power consumption are all critical design requirements.

In view of the above, the present disclosure is directed to methods and apparatus for providing a APD bias circuit with dual analog feedback loop control suitable for use in small form factor devices, such as OFEs for consumer electronics.

In accordance with a first aspect of the invention a bias circuit is provided. A bias circuit of an avalanche photodiode, APD, comprising: a voltage conversion module connected to the APD, wherein the voltage conversion module is configured to convert an input supply voltage (Vin) to a bias voltage for the APD; an error amplifier connected to the voltage conversion module for implementing a feedback control; a voltage feedback loop configured to provide the error amplifier a first analog signal related to the bias voltage; and a current feedback loop configured to provide the error amplifier a second analog signal related to an APD current; wherein the first analog signal and the second analog signal are provided to the error amplifier via a feedback node (FB) and the error amplifier is configured to control the voltage conversion module based on the first and the second analog signals.

The bias circuit is used to supply power to an APD and to assist it to operate properly under different operation conditions. Furthermore, since an APD is an electrically delicate module, it is also advantageous to regulate the bias circuit to protect the APD from damage.

On the one hand, the APD requires a relatively high bias voltage to operate, moreover, the gain to be provided by the APD is also closely related to the bias voltage. Since the required gain may spread over a large range, the corresponding bias voltage also needs to be adapted. On the other hand, it is also desirable to monitor the APD current, which provides an indication on the strength of a received optical signal. The APD current is preferably the APD's average current, but it may also be a rms value, or a current value after a certain filter stage. Given the dynamic range of the processing circuits after the APD in an optical receiver, it is preferred to maintain a received signal strength close to an optimal level, or at least within the dynamic range. The current feedback loop may also be used to determine if there is a degradation or damage of an optical or electrical component in the system, allowing corrective measures to be taken.

The disclosed bias circuit comprises both voltage and current feedback loops to regulate the operation of the voltage conversion module. As compared to a conventional solution that makes use of an MCU in the loop, the feedback control in the disclosed bias circuit relies purely on analog signals. And thus, it provides a low cost and small form factor solution to the design. The control function is mainly implemented by an error amplifier that uses the input of the first analog signal and the second analog signal.

The bias circuit may also be used to supply voltage to another type of light sensor, which has a similar property as the APD.

In one example, the error amplifier comprises an operational amplifier configured to compare a feedback signal according to either the first analog signal or the second analog signal against a reference, and the comparison result is integrated and used to control the voltage conversion module.

The operational amplifier compares the feedback signal, provided by either the voltage feedback loop or the current feedback loop, against a reference, and the error is integrated. The output of the error amplifier controls the power stage of the voltage conversion module. The control of the voltage conversion module may be implemented directly, or indirectly. For example, the output of the error amplifier may be used to control a pulse width modulator, and the pulse width modulator is used to regulate the power stage of the voltage conversion module.

Beneficially, the first analog signal and the second analog signal are provided to the error amplifier via a feedback node (FB).

By providing the first and second analog signals via a same input node, the feedback node of the error amplifier, the feedback loop is thus controlled by both the first analog signal and the second analog signal in a dynamic approach, such that each time with the stronger signal out of the first analog signal and the second analog signal dominating the loop. For example, when the current loop is active and controlling the APD bias voltage, the voltage loop still plays a role by acting as the inner loop of the feedback control, such that the voltage loop injects a current to the FB pin proportional to output voltage.

Advantageously, the first analog signal is captured via a voltage divider connected to an output node of the voltage conversion module.

A voltage divider is a passive circuit, which produces an output voltage that is a fraction of its input voltage. Voltage division is the result of distributing the input voltage among the components of the divider. One example of a voltage divider is two resistors connected in series, with the input voltage applied across the resistor pair and the output voltage emerging from the connection between them.

Depending on the structure of the voltage conversion module, the first analog signal may be captured via an intermediate stage of the voltage conversion module. It helps to reduce the number of resistors in the feedback loop, which are otherwise required for feeding back the first analog signal to the error amplifier from a last stage of the voltage conversion module.

Beneficially, the second analog signal is captured via a current sensing resistor Rs connected to the APD in series.

Current sensing is used to detect the APD current. Preferably, it is the APD's average current, but it may also be a rms value, or a current value after a certain filter stage. Different types of current sensors with different sensing techniques may be used to measure or detect the current flow. A commonly used and cost-effective solution for current sensing is the shunt current sensor method.

Preferably, a capacitor is connected in parallel to the resistor Rs to bypass high frequency signals, thus creating an AC ground.

The capacitor bypasses high frequency signal and increases the cut-off frequency of an AC coupling circuit connected between the APD and a further Transimpedance Amplifier (TIA). This is advantageous because when the system is used for optical wireless communication there might be an IR signal present in the optical signal, which is captured by the APD and presented as an interference. By increase the cut-off frequency, the IR signal may be filtered out.

In one setup, the first analog signal is connected to the feedback node via a diode.

A diode conducts current primarily in one direction, and it is configured to conduct when the bias voltage is above a certain threshold. Since the first analog signal is related to the output voltage of the voltage conversion module, the diode conducts when the output voltage is above a certain threshold, which typically happens when the APD requires a higher gain, such as when the received optical signal gets weak or the temperature increases.

In another setup, the second analog signal is connected to the feedback node via an emitter follower.

An emitter follower has a high input impedance, and low output impedance. The construction of an emitter follower circuit is similar to a normal amplifier. The main difference is that a load is absent at the collector terminal but present at the emitter terminal of the circuit. Thus, the output is taken from the emitter terminal. The biasing may be provided either by a base resistor method or by a potential divider method.

In the bias circuit, when there is no incoming optical signal or a received optical signal is weak, the emitter follower transistor is not conductive. Thus, the current feedback loop is not active. When the received signal is strong enough or the average APD current is above a certain threshold, the base-emitter conducts, and the current feedback loop takes effect.

In one example, the bias circuit further comprises a temperature sensing element for compensating a temperature dependence of a required bias voltage for achieving a certain gain level of the APD.

The temperature sensing element is one of a NTC thermistor, a PTC thermistor, or another temperature sensitive component for use in an electrical circuit.

Considering that a reverse bias voltage and gain response of an APD has a high temperature dependency, it is advantageous to introduce a temperature sensing element in the bias circuit to offset that effect.

A thermistor is a type of resistor whose resistance is strongly dependent on temperature, more than standard resistors, which is widely used in temperature sensors. A thermistor may have a negative temperature coefficient (NTC) or a positive temperature coefficient (PTC). With NTC thermistors, resistance decreases as temperature rises. To the contrast, With PTC thermistors, resistance increases as temperature rises.

Beneficially, the temperature sensing element is a NTC thermistor, which is configured to form a series circuit with a tuning resistor, wherein the series circuit is connected to the feedback node of the error amplifier.

In a preferred setup, the bias circuit further comprises an RC filter connected between the voltage conversion module (110) and the APD.

A resistor-capacitor circuit (RC circuit), also called RC filter or RC network, is typically used to filter a signal by blocking certain frequencies and passing others. The two most common RC filters are the high-pass filters and low-pass filters. Here, a low pass filter is implemented for the input to the APD. The resistor has an effect of providing negative feedback to the APD current when the resistance is above a certain value.

Advantageously, the bias circuit is further configured to provide bias to more than one APD, wherein the voltage conversion module is connected to each APD via an RC filter, and the more than one RC filter is constructed by: connecting an output of the voltage conversion module to the more than one APD via more than one cathode resistor, with each APD connected to an individual cathode resistor; connecting a first capacitor between ground and a first node between a first cathode resistor and a corresponding first APD; and connecting a further capacitor between the first node and a further node between a further cathode resistor and a corresponding further APD.

APDs require individual resistors at the cathode due to tolerances of the reverse breakdown voltage. Thus, to apply RC filtering to the supply voltage provided to the more than one APD usually requires high voltage capacitors for each APD to implement the RC filter individually. This might result in multiple high voltage capacitors, one for each APD, and a large circuit size. Therefore, it is proposed that the APDs are coupled via low voltage capacitors between their cathodes and there is only one high voltage capacitor connected to ground. Thus, the required circuit area is substantially reduced. This is even more beneficial with an increasing number of APDs.

Advantageously, the voltage conversion module comprises more than one up-conversion stage, and the voltage feedback loop is obtained from an intermediate up-conversion stage.

The up conversion from input supply voltage to a required bias voltage of the APD may be implemented by multiple up-conversion stages. Such multi-stage up conversion can be very beneficial when a high gain is required from the APD.

In such a case, it is also preferable to obtain the voltage feedback signal from a first stage or another intermediate stage, other than the last stage. By feeding back a relatively lower voltage helps to reduce the number of resistors required in the feedback loop.

As one option, the voltage conversion module comprises a boost converter as a first stage and a voltage multiplier connected to the boost converter as a further stage, and the first analog signal is captured via a voltage divider connected to an output node of the boost converter (Vout) instead of the output node (VR) of the voltage conversion module.

A voltage multiplier is an electrical circuit used to convert electrical power from a lower voltage to a higher voltage, which may be implemented as a voltage doubler or a voltage tripler. A voltage doubler uses two stages to approximately double the DC voltage that would have been obtained from a single-stage rectifier. A voltage tripler is a three-stage voltage multiplier, which is a popular type of voltage multiplier. Thus, the voltage conversion module may comprise a boost converter and a voltage doubler as one setup. In another setup, the voltage conversion module may comprise a boost converter and a voltage tripler.

The voltage feedback loop is designed to provide a feedback signal related to the reverse bias voltage of the APD. By capturing the first analog signal via the voltage divider connected to the first stage of the voltage up-conversion, or some other stage before the last stage, it helps to reduce the number of resistors in the feedback loop, which are otherwise required for feeding back the first analog signal from the latest stage of the voltage up-conversion to the error amplifier.

Preferably, the first analog signal is captured via the voltage divider connected to the output of the boost converter.

BRIEF DESCRIPTION OF THE DRAWINGS

In the drawings, like reference characters generally refer to the same parts throughout the different figures. Also, the drawings are not necessarily to scale, emphasis instead generally being placed upon illustrating the principles of the invention.

DETAILED DESCRIPTION OF EMBODIMENTS

The embodiments set forth below represent information to enable those skilled in the art to practice the embodiments and illustrate the best mode of practicing the embodiments. Upon reading the following description in light of the accompanying drawings, those skilled in the art will understand the concepts of the disclosure and will recognize applications of these concepts not particularly addressed herein. It should be understood that these concepts and applications fall within the scope of the disclosure.

Figure 1:
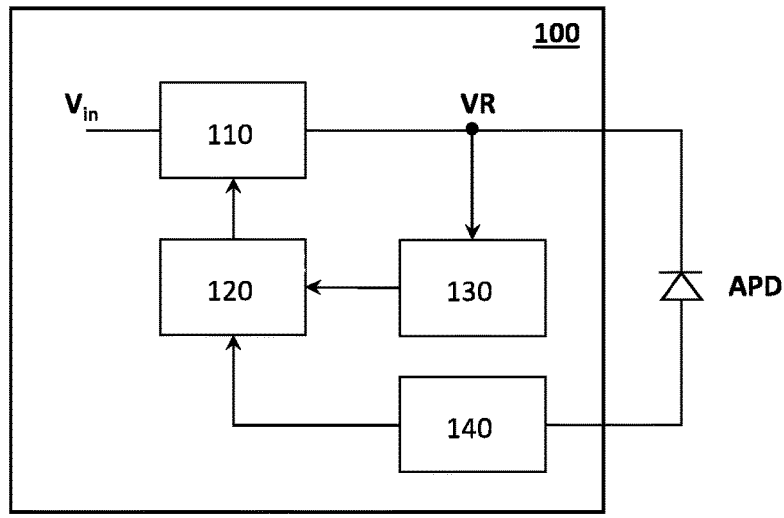
FIG. 1 demonstrates a basic block diagram of the bias circuit of an APD.

FIG. 1 demonstrates a basic block diagram of the bias circuit 100 of an APD. As a basic example, the bias circuit 100 comprises a voltage conversion module 110, an error amplifier 120, a voltage feedback loop 130, and a current feedback loop 140. The booster converter is configured to convert an input supply voltage $V_{in}$ to an output voltage $V_{out}$, which may be used directly to supply the APD as the reverse bias voltage VR.

It is intended to provide a solution on miniaturized bias voltage compensation circuit without the use of an MCU. The bias circuit 100 comprises two control loops: the voltage regulation loop 130 and the APD current regulation loop 140. Only analog feedback signals are used, with the first analog signal related to the output voltage of the voltage conversion module and the second analog signal related to the average current of the APD.

In a first option, the average APD current is regulated by the bias supply circuit via feedback control. Under a normal operation, the APD current is regulated to a constant level, thus achieving automatic gain control (AGC). When the reverse bias voltage reaches a max level, the feedback loop operates in voltage regulation mode, setting the reverse bias voltage to a constant (max) level. This mode of control is named constant current constant voltage (CCCV) dual loop control.

In a second option, the APD is operated with constant voltage supply till the current reaches a high level (e.g., when the received optical signal intensity is sufficiently high). At this point the current feedback loop is activated and takes over from the voltage loop. The APD current is then regulated to a constant current. This setup enables a higher cut off frequency (e.g., >100 kHz) of the AC coupling to a TIA stage connected to the APD, thus reducing interference to optical communication from other sources, such as an IR remote controller. This mode of control is named constant voltage constant current (CVCC) dual loop control.

Figure 2:
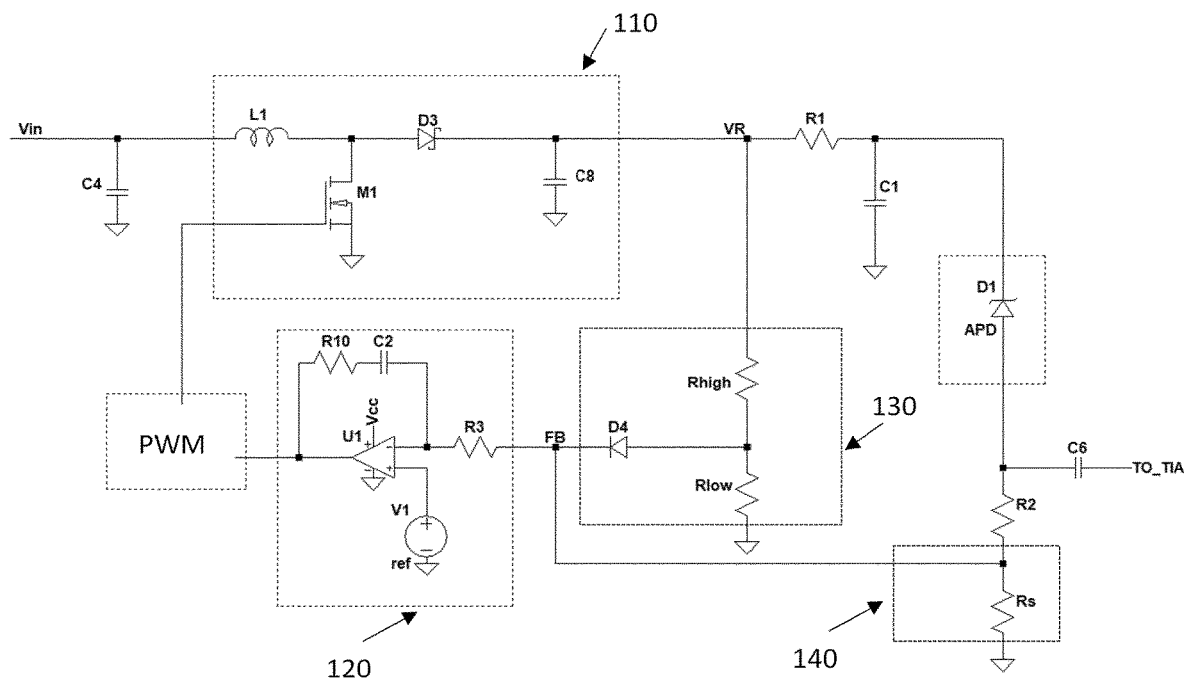
FIG. 2 illustrate one implementation of the bias circuit with a CCCV dual loop control.

FIG. 2 illustrate one implementation of the bias circuit 100 with a CCCV dual loop control. As an example, the APD reverse bias circuit 100 may be powered from a 3.3V or 5V supply $V_{in}$, and then boosted by a boost power stage (L1, M1, D3) 110 to the bias voltage VR, typically 70 to 200V, depending on the type of an APD. The bias voltage VR is further filled by an RC stage R1, C1, for reducing the noise, and then applied to the cathode of the APD. The resistor R1 provides a certain degree of negative feedback (when APD current rises, voltage at cathode drops, thus some form of auto-adjustment). The larger R1 is, the stronger this effect becomes. A preferred value of R1 is around 1 MΩ.

The APD current is sensed via a current sensing resistor Rs and is fed to the error amplifier U1, which is used for feedback control. U1 compares the feedback signal against a reference ref and the error is integrated. In this example, the output of the error amplifier controls the PWM modulator and in turn the power stage. In a steady state, the APD current is maintained constant. The voltage feedback signal is obtained via the voltage divider comprising two resistors $R_{high}$ and $R_{low}$, and the voltage feedback signal is applied to the error amplifier via a diode D4.

When the optical signal is strong, the current loop is active. As the signal gets weak and/or the temperature increases, the output voltage VR tends to increase and eventually D4 conducts. When this happens, the voltage loop takes over from the current loop and regulates VR to a constant level (i.e., the max level the circuit is designed for). The high frequency signal at the anode of the APD is fed to a transimpedance amplifier (TIA) via an AC coupling capacitor C6 for further processing.

Figure 3:
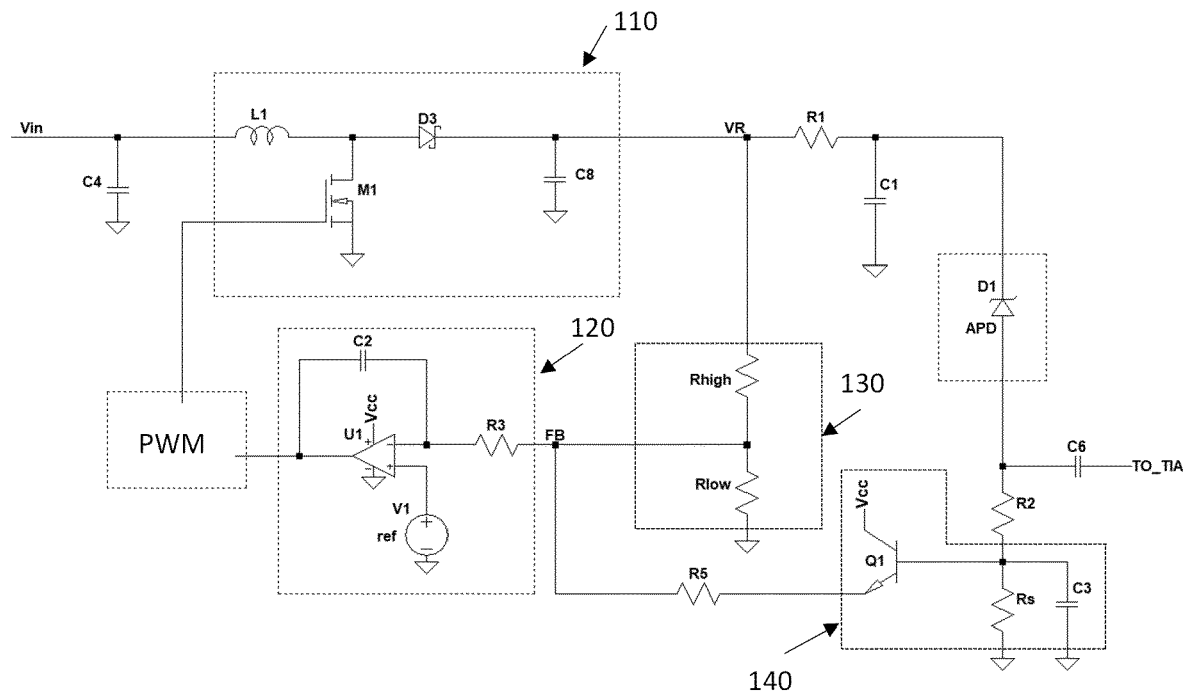
FIG. 3 illustrate one implementation of the bias circuit with a CVCC dual loop control.

FIG. 3 illustrate one implementation of the bias circuit with a CVCC dual loop control. Different from a CCCV approach, in CVCC the APD current is sensed and injected to the error amplifier 120 via an emitter follower Q1. If the APD current is low, such as the received optical signal is weak or even no optical signal received, the circuit operates in constant voltage mode and is regulated via the voltage loop ($R_{high}$ and $R_{low}$). The circuit remains in CV mode until the APD's (average) current reaches a certain threshold (e.g., 10 uA), which happens when a received signal strength is strong enough. Q1 base-emitter conducts and imposes the feedback from the current loop to the error amplifier. Thus, the current feedback loop takes over and regulates the APD current to a constant level. With a strong received signal, it also indicates less gain is needed from the APD. The error amplifier controls the voltage conversion module to reduce the bias voltage VR to a certain level, and then the APD current can be maintained to the max limit (e.g., said 10 uA).

The CCCV method is more stable than the CVCC method because the voltage loop acts as an inner loop improving the system response. For this reason, additional capacitor C3 may be connected in parallel to the current sensing resistor Rs. C3 may then bypass high frequency signal and increase the cut off frequency of the AC coupling circuit C6, R2. This is advantageous when there are IR signals (such as from a remote controller) present in the optical communication channel (e.g., by set the cut off to >=100 kHz, while IR remote operates at 30-50 kHz). The AC coupled signal is provided to the TIA for further processing.

Figure 4:
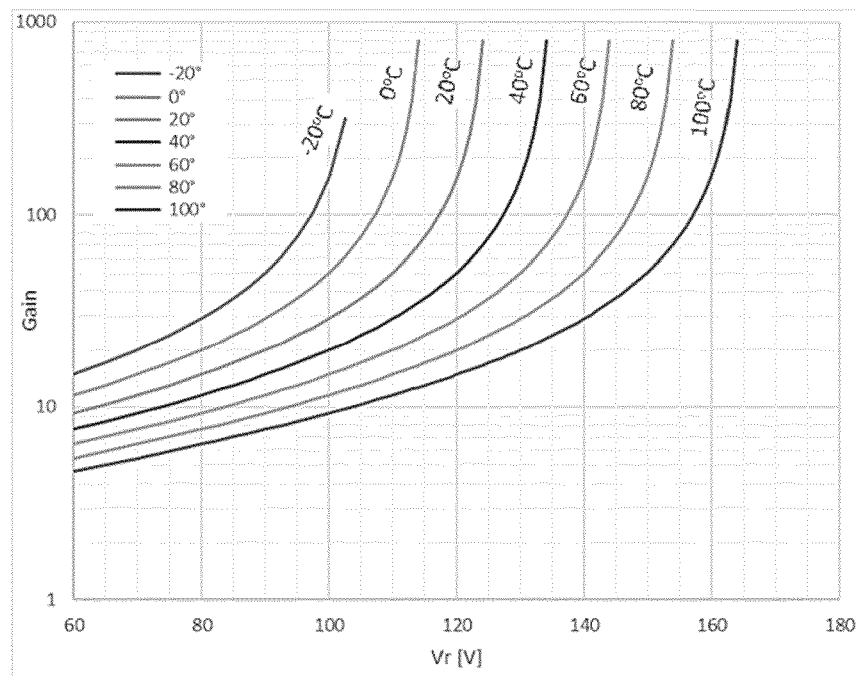
FIG. 4 shows an example of temperature dependence between gain vs. reverse voltage of an APD device.

FIG. 4 shows an example of temperature dependence between gain vs. reverse voltage of an APD device. It can be seen that the gain and reverse voltage response has a high temperature dependency. In the example, to achieve a same gain of 20 dB (100 in the linear scale), the required reverse voltage may change from less than 100V to close to 160V when the temperature is increased from −20° C. to +100° C. Thus, the bias circuit may further comprise a temperature feedback for adjusting reverse bias voltage of the APD according to the temperature, such that the APD is operated in a gain region optimal for signal to noise ratio (SNR).

Figure 5:
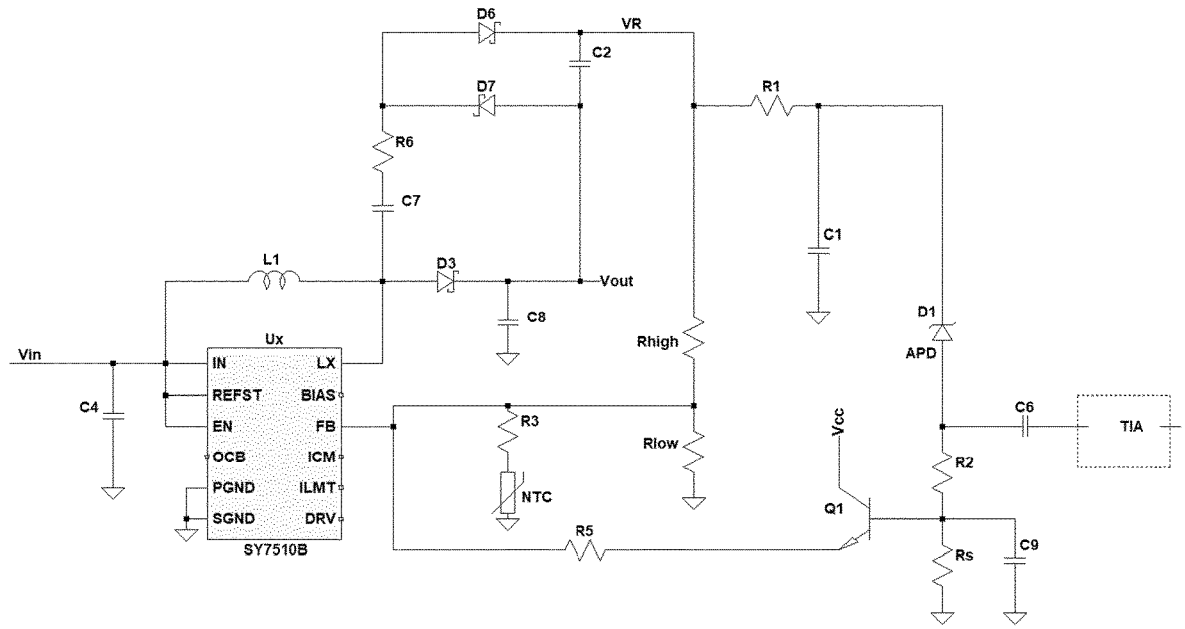
FIG. 5 illustrates an example of detailed implementation with temperature compensation.

FIG. 5 illustrates an example of detailed implementation with temperature compensation. The setup of CVCC method is used as an example here. However, it shall be understood that the temperature compensation can be applied to both CCCV and CVCC methods.

The circuit is built around a boost controller with integrated MOSFET Ux (e.g., SY7501B, but can be any suitable types). The chip SY7501B Ux can work till an absolute max of 80V (breakdown voltage of the internal power MOSFET). Si based APD typically requires >100V reverse bias. An external charge pump (D6, D7, C7, C2) is used to double the voltage. With this arrangement, VR can reach 150V (sufficient for the APDs). The CVCC method is used as an example here. Similar implementation may also be applied to CCCV method.

In this example, an NTC is included in the circuit to implement temperature compensation. With careful selection of the NTC, tuning resistor R3, together with $R_{high}$ and $R_{low}$, a desired compensation characteristic can be achieved. Other than the exemplarily shown NTC, the temperature sensing element may also be implemented with PTC or another temperature sensitive component, such as PN junction of a diode, and a corresponding circuit adaptation according to the characteristic of the component may be needed.

Figure 6:
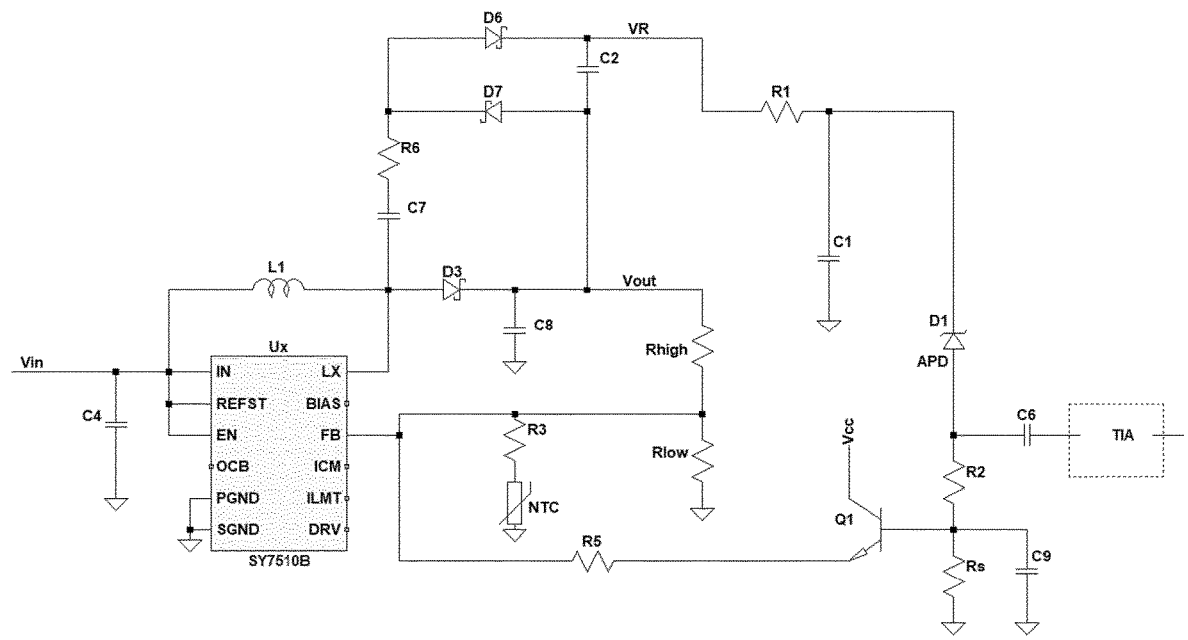
FIG. 6 illustrates an example of detailed implementation by taking voltage feedback from $V_{out}$ node.

FIG. 6 illustrates an example of detailed implementation by taking voltage feedback from $V_{out}$ node. Typically, the voltage feedback is taken directly from the bias voltage VR of the APD. Note that the bias circuit may further comprise a voltage multiplier, a voltage doubler, or a voltage tripler, in order to use commercial chips designed for typically operating below 90V, to reach an operation region above 100V reverse bias. A method for saving the number of high voltage resistors (to reduce circuit size), which constitute $R_{high}$ ($R_{high}$ is shown schematically in the figure with a single resistor, but actually it may comprise several resistors in practice to handle the high voltage), is proposed by taking voltage feedback at a node before the multiplier (a doubler in the example circuit). Therefore, the voltage feedback is now taken from $V_{out}$ node. Since VR is typically designed at around 150V, the feedback resistor $R_{high}$ needs to withstand that high voltage. If small 0201 package SMD resistor are used, it may require 4 pieces of such resistors. Therefore, it is more beneficial to take voltage feedback from $V_{out}$ node from the boost converter, which is around 75V. In that sense, two 0201 resistors are saved, contributing to a step for miniaturization. Although in this approach $V_{out}$ instead of the bias voltage VR is directly regulated, this will not impact the voltage regulation too much. In this example, a voltage doubler is used to boost $V_{out}$ to VR, and thus VR is approximately two times $V_{out}$.

Figure 7:
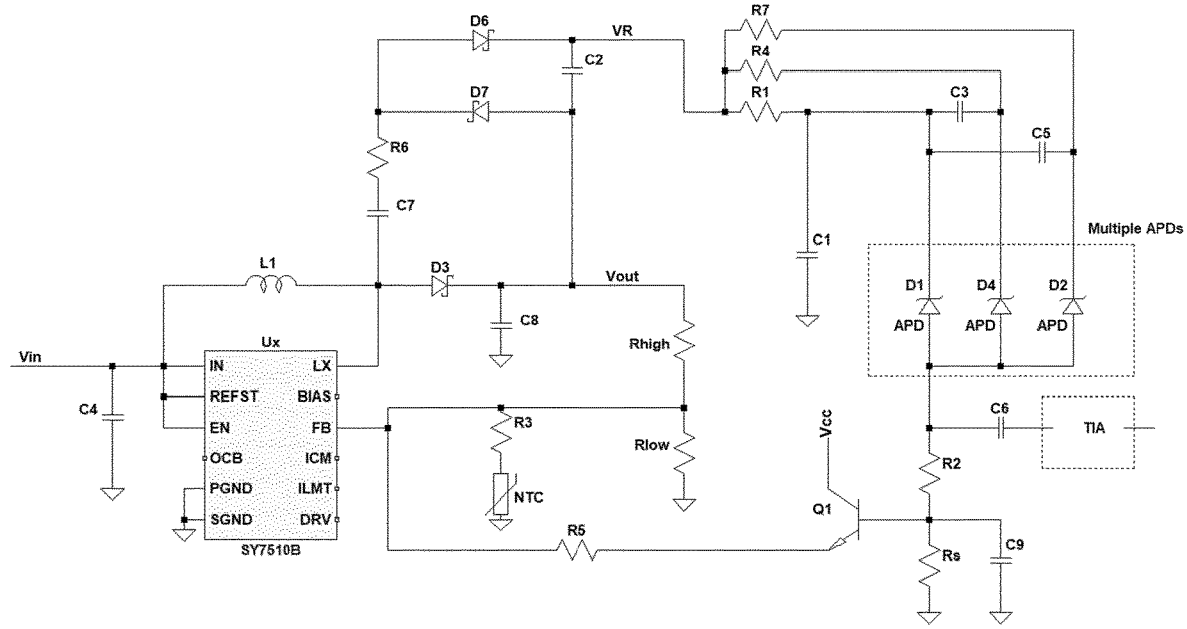
FIG. 7 illustrates an example of detailed implementation to supply more than one APD.
Figure 8:
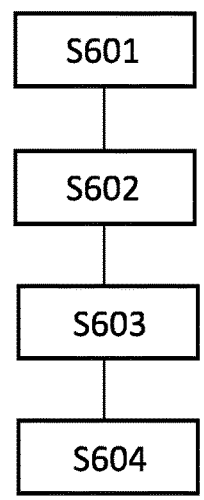
FIG. 8 shows a flow chart of a method of the bias circuit.

FIG. 7 illustrates an example of detailed implementation to supply more than one APDs. For some application scenarios, it may be beneficial to deploy more than one APDs in a single optical front end (OFE) module, such that by making use of multiple small low cost APDs to cover a relatively large field of view (FoV). In the current example of FIG. 7, three APDs are connected to the same bias circuit. Since APDs are preferably not directly connected in parallel, each APD requires its own cathode resistor because of reverse voltage spread. Usually this would also need high voltage capacitors for each APD to implement an RC filter function for each branch, which will result in three high voltage capacitors (e.g., rated at least 150V) and a relatively large circuit size. An improvement is proposed. The multiple APDs are coupled together via capacitors between their cathodes (C3, C5) and there is only one high voltage capacitor C1 connected to ground. C3 and C3 are rated at a lower voltage (e.g., 50V or below), which is much smaller than the high voltage capacitor C1, thus enabling further space saving. Cathode resistor for each APD remains at preferred value of around 1 MΩ.

Methods, systems, and computer-readable media (transitory and non-transitory) may also be provided to implement selected aspects of the above-described embodiments.

The invention claimed is:

1. A bias circuit of an avalanche photodiode, APD, comprising:
    a voltage conversion module connected to the APD, wherein the voltage conversion module is configured to convert an input supply voltage to a bias voltage for the APD;
    an error amplifier connected to the voltage conversion module for implementing a feedback control;
    a voltage feedback loop configured to provide the error amplifier a first analog signal related to the bias voltage; and
    a current feedback loop configured to provide the error amplifier a second analog signal related to an APD current;
    wherein the first analog signal and the second analog signal are provided to the error amplifier via a feedback node and the error amplifier is configured to control the voltage conversion module based on the first and the second analog signals.

2. The bias circuit according to claim 1, wherein the error amplifier comprises an operational amplifier configured to compare a feedback signal according to either the first analog signal or the second analog signal against a reference, and wherein the comparison result is integrated and used to control the voltage conversion module.

3. The bias circuit according to claim 1, wherein the first analog signal is captured via a voltage divider connected to an output node of the voltage conversion module.

4. The bias circuit according to claim 1, wherein the second analog signal is captured via a current sensing resistor Rs connected to the APD in series.

5. The bias circuit according to claim 4, wherein a capacitor is connected in parallel to the resistor Rs to bypass high frequency signals, thus creating an AC ground.

6. The bias circuit according to claim 1, wherein the first analog signal is connected to the feedback node via a diode.

7. The bias circuit according to claim 1, wherein the second analog signal is connected to the feedback node via an emitter follower.

8. The bias circuit according to claim 1, the bias circuit further comprising a temperature sensing element for compensating a temperature dependence of a required bias voltage for achieving a certain gain level of the APD.

9. The bias circuit according to claim 8, wherein the temperature sensing element is a NTC thermistor, which is configured to form a series circuit with a tuning resistor, wherein the series circuit is connected to the feedback node of the error amplifier.

10. The bias circuit according to claim 1, the bias circuit further comprising an RC filter connected between the voltage conversion module and the APD.

11. The bias circuit according to claim 10, the bias circuit further configured to provide a bias to more than one APD, wherein the voltage conversion module is connected to each APD via an RC filter, and the more than one RC filter is constructed by:
    connecting an output of the voltage conversion module to the more than one APD via more than one cathode resistor, with each APD connected to an individual cathode resistor;
    connecting a first capacitor between ground and a first node between a first cathode resistor and a corresponding first APD; and
    connecting a further capacitor between the first node and a further node between a further cathode resistor and a corresponding further APD.

12. The bias circuit according to claim 1, wherein the voltage conversion module comprises more than one up-conversion stage, and the voltage feedback loop is obtained from an intermediate up-conversion stage.

13. The bias circuit according to claim 1, wherein the voltage conversion module comprises a boost converter as a first stage and a voltage multiplier connected to the boost converter as a further stage, and the first analog signal is captured via a voltage divider connected to an output node of the boost converter instead of the output node of the voltage conversion module.

* * * * *